(12) United States Patent
Pappalardo et al.

(10) Patent No.: US 7,178,044 B2
(45) Date of Patent: Feb. 13, 2007

(54) ARCHITECTURE FOR CONTROLLING DISSIPATED POWER IN A SYSTEM-ON-CHIP AND RELATED SYSTEM

(75) Inventors: Francesco Pappalardo, Paternò (IT); Luigi Mantellassi, Ornex (FR)

(73) Assignees: STMicroelectronics SA, Montrouge (FR); STMicroelectronics S.r.l., Agrate Brianza (IT)

( * ) Notice: Subject to any disclaimer, the term of this patent is extended or adjusted under 35 U.S.C. 154(b) by 404 days.

(21) Appl. No.: 10/440,044

(22) Filed: May 16, 2003

(65) Prior Publication Data

US 2004/0019814 A1    Jan. 29, 2004

(30) Foreign Application Priority Data

May 17, 2002  (EP)  .................. 02011094

(51) Int. Cl.
*G06F 1/26* (2006.01)

(52) U.S. Cl. .................. 713/300; 713/320; 713/321; 713/323

(58) Field of Classification Search ............... 713/300, 713/320, 321, 323

See application file for complete search history.

(56) References Cited

U.S. PATENT DOCUMENTS

| | | | | |
|---|---|---|---|---|
| 5,546,591 | A | * | 8/1996 | Wurzburg et al. .......... 713/322 |
| 5,585,745 | A |   | 12/1996 | Simmons et al. ............. 326/93 |
| 5,689,714 | A | * | 11/1997 | Moyer ........................ 713/310 |
| 5,832,286 | A | * | 11/1998 | Yoshida ..................... 713/324 |
| 5,953,237 | A |   | 9/1999 | Indermaur et al. ........ 364/528.3 |
| 5,996,083 | A |   | 11/1999 | Gupta et al. ................. 713/322 |
| 6,665,802 | B1 | * | 12/2003 | Ober ........................... 713/320 |
| 6,785,826 | B1 | * | 8/2004 | Durham et al. ............. 713/300 |
| 6,834,353 | B2 | * | 12/2004 | Smith et al. ................. 713/320 |
| 6,968,467 | B2 | * | 11/2005 | Inoue et al. ................. 713/320 |
| 2002/0026598 | A1 | * | 2/2002 | Osborn ....................... 713/323 |
| 2002/0053039 | A1 | * | 5/2002 | Inoue et al. ................. 713/323 |
| 2002/0184547 | A1 | * | 12/2002 | Francis ....................... 713/322 |
| 2002/0199050 | A1 | * | 12/2002 | Joshi et al. .................. 710/104 |
| 2003/0167413 | A1 | * | 9/2003 | Stachura et al. ............ 713/300 |

FOREIGN PATENT DOCUMENTS

| | | |
|---|---|---|
| DE | 19706496 | 2/1997 |
| EP | 0676685 | 11/1995 |
| EP | 1117031 | 7/2001 |

* cited by examiner

*Primary Examiner*—Thomas C. Lee
*Assistant Examiner*—Vincent Tran
(74) *Attorney, Agent, or Firm*—Lisa K. Jorgenson; Allen, Dyer, Doppelt, Milbrath & Gilchrist, P.A.

(57) ABSTRACT

A system-on-chip (SoC) architecture includes a plurality of blocks, each including a power control module to selectively control the power dissipated by the bloc. For each block, a power register is provided to receive power control instructions to selectively control the respective power control module. The system also includes a power control unit for writing respective power control instructions into the power control registers of the blocks, whereby the power dissipated is controlled individually and independently for each block under the centralized control of the power control unit. For each block, a power status register is also provided to receive status information concerning power control within the respective block. The power control unit reads the status instructions from such power status registers.

19 Claims, 2 Drawing Sheets

ARCHITECTURE FOR CONTROLLING DISSIPATED POWER IN A SYSTEM-ON-CHIP AND RELATED SYSTEM

FIELD OF THE INVENTION

The present invention relates to so-called Systems-on-Chip (SoC's) and is primarily concerned with controlling the power dissipated by various blocks or modules included in such a system.

BACKGROUND OF THE INVENTION

A wide variety of devices exist at present currently referred to as a System-on-Chip (SoC), such a designation being often adopted to designate in general devices integrating several digital blocks. Such an SoC has a structure of the type shown in FIG. 1, namely a structure including a plurality of blocks M1, M2, . . . Mn acting as "master" blocks as well as a plurality of blocks S1, S2, . . . Sn acting as "slave" blocks. The blocks in question communicate through one or more buses. To simplify the description, just one bus—designated BUS1—will be considered in the following. However, all the remarks made both in respect of the prior art and in respect of the invention apply identically to arrangements including a plurality of buses.

The "master" blocks are generally intended to control the SoC by controlling the "slave" blocks. For instance, one master block (e.g. master block M1) can be a CPU, while slave blocks S1, S2, . . . , Sn are quite often represented by peripheral units such as display units, interfaces, etc. Operation of the SoC 10, is synchronized by a clock signal, generated by a clock generator 12 to be distributed to the various blocks as indicated by lines 14. Again, a plurality of such clock generators may be included in a single SoC. In the following only one clock generator 12 and the respective clock signal will be considered for the sake of simplicity.

Technological development, especially in respect of integration of CMOS transistors, leads to an increasing level of integration of digital devices. As a result of this, increasingly complex and sophisticated circuits (including entire digital systems) can be integrated to a single device in the form of a SoC. A factor militating against that tendency is the amount of power dissipated in the form of heat by the device. For that reason, solutions are needed which enable a judicious reduction of the power dissipated by the device.

SUMMARY OF THE INVENTION

An object of the present invention is to provide an architecture that enables the power dissipated in an SoC to be effectively controlled and reduced.

In the arrangement of the invention the power dissipated by each individual IP (Intellectual Property) block is controlled independently with respect to the other IPs included in the same SoC via decentralized control functions adapted to be managed in a centralized manner. The advantages of the invention increase with the number of the digital blocks included in the SoC and with the diversity of such blocks. Nonetheless, the invention leads to advantageous results also in connection with very small systems.

The basic idea underlying the invention is to resort to a distributed control of dissipated power. Specifically, the architecture of the invention allows the dissipated power of the entire system to be controlled by individually controlling each IP in the system independently of the others by applying a central management function via a so-called Power Control Unit or PCU.

BRIEF DESCRIPTION OF THE DRAWINGS

The invention will now be described, by way of example only, with reference to the enclosed figures of drawing, wherein.

DETAILED DESCRIPTION OF THE PREFERRED EMBODIMENTS

Figure 1:
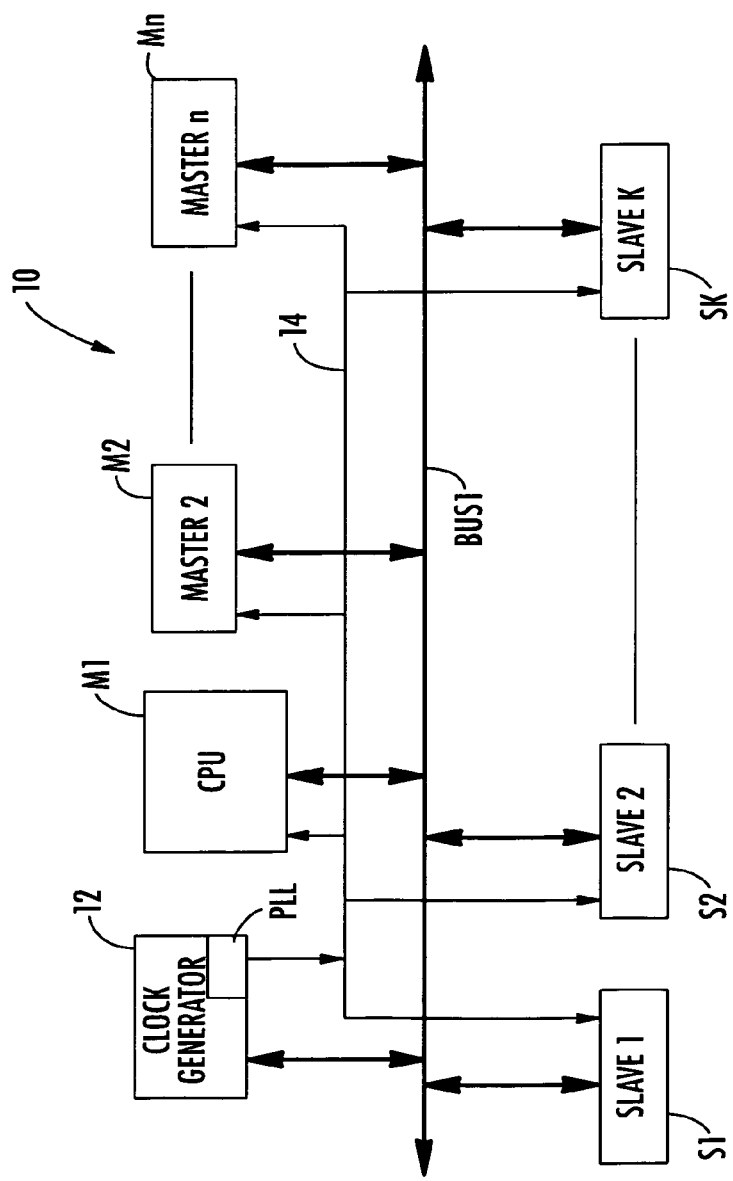
FIG. 1 is a schematic block diagram of a conventional SoC.
Figure 2:
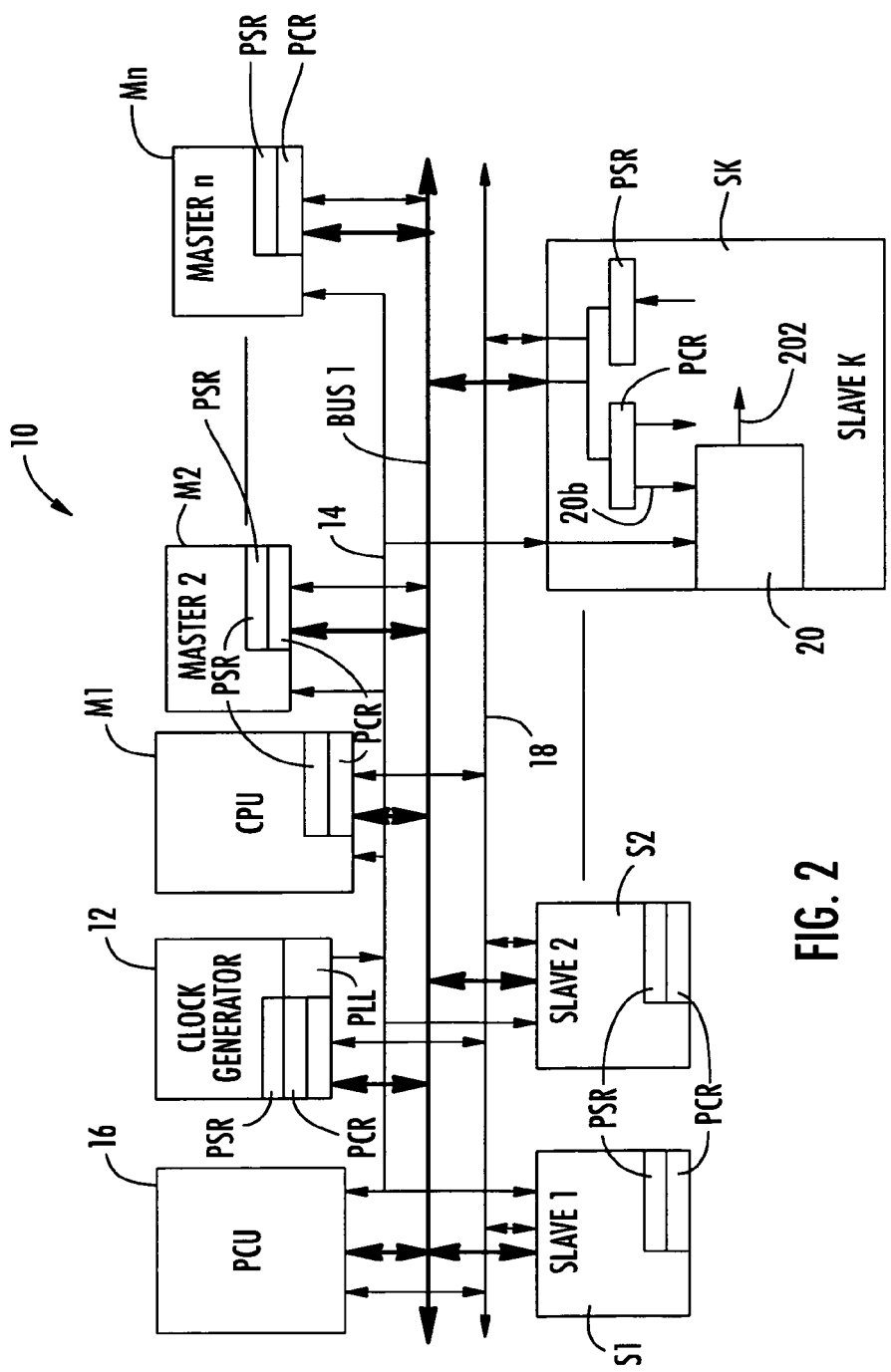
FIG. 2 is a schematic block diagram showing an exemplary embodiment of the present invention.

In FIG. 2, the same reference signs/numerals were used to designate parts/elements which are identical or equivalent to those already described in connection with FIG. 1.

The embodiment of the invention shown herein is based on the provision in the various blocks/modules, both of the master type (M1, M2, . . . , Mn) and of the slave type (S1, S2, Sn) of two registers designated PCR (Power Control Register) and PSR (Power Status Register), respectively. Preferably, such registers are also included in the clock generator block(s) 12. Registers PCR and PSR permit the status of the respective block to be controlled (activated/deactivated) and read individually for each block. This choice is primarily intended to permit the power dissipated to be controlled locally, that is by resorting to a distributed approach, while the power control policy is managed in a centralized manner.

Each block in SoC 10 is designed by using any of the techniques currently adopted for reducing the power dissipated, namely by "freezing" the respective clock signal (so-called "gated clock" approach), by reducing the clock frequency, etc. Such control action of the power dissipated may be effected—in a known manner—via respective signals that are generated locally via the PCR registers, which permits control of the power dissipated by each respective, individual digital block.

The enlarged view of slave block Sk shows, just by way of example, a respective power control unit 20 adapted to implement, via output line 20*a*, a respective power control strategy e.g. of the "gated clock" or "clock division" type. Such as strategy is effected in conformity with power control signals provided by the corresponding PCR register over a line 20*b*, as a function of the clock signal delivered over line 14. Similar arrangements are provided for all the other blocks included in SoC 10, thus permitting a respective power control strategy to be effected for each block distinctly and independently of any other block in the SoC.

The PSR registers, each of which is written by the corresponding block, enable the status of the block controlled to be read from outside. Reference 16 designates in FIG. 2 a so-called power control unit (PCU) which is connected via a bus line 18 with the PCR registers included in the various blocks of SoC 10. Power control unit 16 has the role of managing the power control "policy" of the whole SoC. This role can be performed in dependence of a variety of factors/parameters such as e.g.: the activity of bus BUS1, monitoring such activity by power control unit 16 is permitted by power control unit 16 being connected to such a bus; information on activity directly provided by the master and/or slave blocks; and information on activity read directly from the power state registers (PSR) of the master/slave blocks. Based on that information, power control unit 16 devises (in a manner known per se) a suitable power control policy which is effected by writing (via line 18) corresponding instructions in the power control registers PCR of the various master/slave blocks and clock generator 12 (which is preferably of the PLL generator type).

As an alternative to resorting to a dedicated bus such as bus 18 shown in FIG. 2, the control instructions in question can be sent from power control unit 16 to the various power control registers PCR via the main bus designated BUS1. In such a case, the power control information is written into registers PCR exactly as any other configuration information written into the registers of the various blocks of SoC 10. To advantage, the PCR registers can be written both by power control unit 16 and master blocks M1, M2, Mn. Similarly, registers PSR can be read both by power control unit 16 and by master blocks M1, M2, . . . , Mn.

The arrangement of the invention allows each and every block in the SoC to implement a respective, individual solution for reducing the dissipated power (e.g. clock gating, bus encoding, etc.) depending on the nature and function of the block itself. Thus, power dissipation may be controlled for each block independently from the other blocks while the power control strategy is supervised in centralized manner by power control unit 16 via power control registers PCR. Also, the various blocks can communicate with the power control unit 16 via power state registers PSR and also exchange information directly via bus 18 or BUS1.

The control process managed by power control unit 16 may thus vary to permit optimization of the results depending on the nature of SoC 10 and the various blocks to be controlled. In that way, the power control unit is in a position to use a simple, optimized architecture for system control.

The arrangement of the invention thus gives rise to a number of substantial advantages. First of all, the techniques of controlling reduction of dissipated power may be different and thus selectively chosen in an optimal manner for each block to be controlled. Secondly, each block can be controlled individually in terms of power reduction by suitably controlling the respective control signals, which enables a very precise control of the power dissipated. Finally, by resorting to central management of the power control strategy, operation of the whole system to be optimized by ensuring correct operation in data exchange between the blocks.

The basic idea of the invention can be extended and applied also at the design level, thus defining a standard based on the proposed architecture achieving full compatibility, in terms of controlling dissipated power, for any IP and/or CPU designed. This also applies to the possible re-use of IPs and in respect of interfacing with other IPs designed by resorting to the same principles. Of course, the basic principle of the invention remaining the same, the details and embodiments may wary with respect to what has been previously described by way of example only, without departing from the scope of the present invention as defined in the annexed claims.

The invention claimed is:

1. A system-on-chip (SoC) comprising:
   a plurality of blocks, each block including a power control module to selectively control the power dissipated by the block, and a respective power control register to receive power control instructions to selectively control the power control module; and
   at least one power control unit for writing respective power control instructions into the power control registers of the plurality of blocks, so that the power dissipated by the blocks is controlled individually and independently for each of said plurality of blocks under the centralized control of the at least one power control unit;
   each block further comprising a power status register to receive status information concerning power control within the respective block, and wherein said at least one power control unit reads the status information from the power status registers of the plurality of blocks;
   the at least one power control unit defining a master block of the plurality of blocks for reading the status information from said power status registers of the plurality of blocks.

2. The SoC of claim 1, wherein said at least one power control unit is a separate block.

3. The SoC of claim 1, wherein the at least one power control unit defines a master block of the plurality of blocks for writing respective power control instructions into the power control registers.

4. The SoC of claim 1, further comprising a main bus to exchange information between the plurality of blocks, and wherein the power control instructions are distributed from said at least one power control unit to the power control registers of the plurality of blocks over said main bus.

5. The SoC of claim 1, further comprising a main bus to exchange information between the plurality of blocks, and wherein statue information is sent from the power status registers of the plurality of blocks towards said at least one power control unit over said main bus.

6. The SoC of claim 1, further comprising a dedicated bus for distributing the power control instructions from said at least one power control unit towards the power control registers of the plurality of blocks.

7. The SoC of claim 1, further comprising a dedicated bus for distributing the power control instructions from said at least one power control unit towards the power control registers of the plurality of blocks, and wherein the status information is sent from the power status registers of the plurality of blocks towards said at least one power control unit over said dedicated bus.

8. A system-on-chip (SoC) comprising:
   a plurality of blocks, each block including a power control module to selectively control power dissipation of the block, and a respective power control register for locally controlling the power control module; and
   at least one power control unit for centrally controlling the power control modules by sending respective power control signals to the power control registers;
   each block further comprising a power status register to receive status information concerning power control within the respective block, and wherein said at least one power control unit reads the status information from the power status registers of the plurality of blocks;
   the at least one power control unit defining a master block of the plurality of blocks for reading the status information from said power status registers of the plurality of blocks.

9. The SoC of claim 8, wherein the at least one power control unit defines a master block of the plurality of blocks for sending respective power control signals to the power control registers.

10. The SoC of claim 8, further comprising a main bus to exchange information between the plurality of blocks, and wherein power control signals are sent from said at least one power control unit to the power control registers over said main bus.

11. The SoC of claim 8, further comprising a main bus to exchange information between the plurality of blocks, and wherein status information is sent from the power status registers towards said at least one power control unit over said main bus.

12. The SoC of claim 8, further comprising a dedicated bus for distributing the power control signals from said at least one power control unit towards the power control registers.

13. The SoC of claim 8, further comprising a dedicated bus for distributing the power control signals from said at least one power control unit towards the power control registers, and wherein status information is sent from the power status registers of the plurality of blocks towards said at least one power control unit over said dedicated bus.

14. A method of operating a system-on-chip (SoC) including a plurality of blocks, the method comprising:

selectively controlling power dissipation of each block by providing each block with a power control module;

locally controlling the power control module with a respective power control register;

centrally controlling the power control modules with at least one power control unit sending respective power control signals to the power control registers;

generating and storing status information concerning power control within the respective block in a power status register; and reading the status information from the power status registers with the at least one power control unit;

the at least one power control unit defining a master block of the plurality of blocks for reading the status information from the power status registers of the plurality of blocks.

15. The method of claim 14, wherein the at least one power control unit defines a master block of the plurality of blocks for sending respective power control signals to the power control registers.

16. The method of claim 14, further comprising exchanging information between the plurality of blocks via a main bus, and wherein power control signals are sent from the at least one power control unit to the power control registers over the main bus.

17. The method of claim 14, further comprising exchanging information between the plurality of blocks via a main bus, and wherein status information is sent from the power status registers towards said at least one power control unit over said main bus.

18. The method of claim 14, further comprising distributing the power control signals from said at least one power control unit towards the power control registers over a dedicated bus.

19. The method of claim 14, further comprising distributing the power control signals from said at least one power control unit towards the power control registers over a dedicated bus, and wherein status information is sent from the power status registers of the plurality of blocks towards the at least one power control unit over the dedicated bus.

* * * * *

UNITED STATES PATENT AND TRADEMARK OFFICE
CERTIFICATE OF CORRECTION

PATENT NO.       : 7,178,044 B2
APPLICATION NO.  : 10/440044
DATED            : February 13, 2007
INVENTOR(S)      : Pappalardo et al.

It is certified that error appears in the above-identified patent and that said Letters Patent is hereby corrected as shown below:

Abstract, Line 3      Delete: "bloc"
                      Insert: -- block --

Column 3, Line 39     Delete: " to "
                      Insert: -- can --

Column 3, Line 50     Delete: " wary "
                      Insert: -- vary --

Signed and Sealed this

Fourth Day of September, 2007

JON W. DUDAS
*Director of the United States Patent and Trademark Office*